(12) United States Patent
Tanaka

(10) Patent No.: US 8,698,203 B2
(45) Date of Patent: Apr. 15, 2014

(54) SEMICONDUCTOR DEVICE WITH CAPACITIVE ELEMENT

(75) Inventor: Bungo Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/558,391

(22) Filed: Jul. 26, 2012

(65) Prior Publication Data

US 2013/0026542 A1  Jan. 31, 2013

(30) Foreign Application Priority Data

Jul. 27, 2011  (JP) ................................ 2011-164716

(51) Int. Cl.
*H01L 27/10*  (2006.01)
*H01L 29/00*  (2006.01)

(52) U.S. Cl.
USPC  257/202; 257/532; 257/E27.01; 257/E29.002

(58) Field of Classification Search
USPC .......... 257/202, 296, 243, 386, 301, E27.092, 257/E27.095, E29.346, E21.396, E21.651, 257/532, E29.002, E27.01
See application file for complete search history.

(56) References Cited

U.S. PATENT DOCUMENTS

| | | | | |
|---|---|---|---|---|
| 5,113,235 A | * | 5/1992 | Tamakoshi ................ | 257/300 |
| 5,354,710 A | * | 10/1994 | Kawaguchi et al. ......... | 438/561 |
| 5,380,674 A | * | 1/1995 | Kimura et al. ............... | 438/241 |
| 6,781,181 B2 | * | 8/2004 | Heo et al. ..................... | 257/301 |
| 7,015,090 B2 | * | 3/2006 | Okazaki et al. .............. | 438/243 |
| 7,304,342 B2 | * | 12/2007 | Nirschl et al. ................ | 257/301 |
| 8,106,437 B2 | * | 1/2012 | Sato et al. .................... | 257/305 |
| 2004/0095896 A1 | * | 5/2004 | Chudzik et al. ............. | 370/254 |
| 2004/0137667 A1 | * | 7/2004 | Ogawa et al. ................ | 438/142 |
| 2004/0232461 A1 | * | 11/2004 | Huang .......................... | 257/296 |
| 2006/0022242 A1 | * | 2/2006 | Sugatani et al. ............. | 257/296 |
| 2006/0170044 A1 | * | 8/2006 | Tu ................................ | 257/347 |
| 2010/0304539 A1 | * | 12/2010 | Matsuura et al. ............ | 438/243 |

FOREIGN PATENT DOCUMENTS

JP  06-310671 A  11/1994

* cited by examiner

*Primary Examiner* — David S Blum
(74) *Attorney, Agent, or Firm* — Rabin & Berdo, P.C.

(57) ABSTRACT

A semiconductor device includes a semiconductor layer having a plurality of active regions that are separated by element isolation grooves, a capacitive film having a sidewall covering portion covering a sidewall of the element isolation grooves, and an electrode film laminated on the capacitive film, and a capacitor element is formed by the semiconductor layer, the capacitive film and the electrode film.

9 Claims, 9 Drawing Sheets

SEMICONDUCTOR DEVICE WITH CAPACITIVE ELEMENT

CROSS-REFERENCE TO RELATED APPLICATION

This application is based upon and claims the benefit of priority from Japanese Patent Application No. 2011-164716, filed on Jul. 27, 2011, the entire contents of which are incorporated herein by reference.

TECHNICAL FIELD

The present disclosure relates to a semiconductor device including capacitor elements.

BACKGROUND

In an example of a semiconductor device, a semiconductor device including a plurality of memory cells arranged on a semiconductor substrate employs a memory cell formed with a MOSFET (Metal-Oxide-Semiconductor Field-Effect-Transistor) and a capacitor. Operations for writing, erasing and reading out information (electronic charges) on the capacitor are performed by driving the MOSFET. However, a reduction of the area of the capacitor along with miniaturization of the memory cell reduces the capacitance per memory cell. Further, this may cause errors in the operation for reading-out stored information or cause unintended erase operation to be performed on stored information due to irradiation of a-ray and the like.

SUMMARY

The present disclosure provides some embodiments of a semiconductor device which is capable of increasing the capacitance of a capacitor element while suppressing an increase in the area of the capacitor element extending on the semiconductor layer.

According to one embodiment of the present disclosure, there is provided a semiconductor device which includes a semiconductor layer having a plurality of active regions separated by element isolation grooves, a capacitive film having a sidewall covering portion that covers a sidewall of the element isolation grooves, and an electrode film laminated on the capacitive film. Further, in this embodiment, a capacitor element is formed with the semiconductor layer, the capacitive film and the electrode film. According to this configuration, the semiconductor layer is separated into a plurality of active regions by the element isolation grooves, and the capacitor element is formed using the sidewall of the element isolation groove. Specifically, the capacitive film of the capacitor element has a sidewall covering portion that covers the sidewall of the element isolation groove. The semiconductor layer and the electrode film face each other with the capacitive film disposed therebetween, thereby forming the capacitor element. Because the capacitive film is arranged using the sidewall of the element isolation groove, it is possible to increase an area of the capacitive film without significantly increasing the area extending on the semiconductor layer, thereby increasing the capacitance of the capacitor element.

According to some embodiments of the present disclosure, the capacitive film further includes an active region covering portion that covers the surface of the active layer. In this configuration, because the capacitive film has the active region covering portion as well as the sidewall covering portion, it is possible to further increase the area of the capacitive film, thereby increasing the capacity of the capacitor element.

According to some embodiments of the present disclosure, the semiconductor device further includes a transistor element formed in the active region (for example, a region not covered by the capacitive film), and the transistor element is electrically connected to the capacitor element. According to this configuration, the transistor element is formed in the active region. In addition, the area of the capacitive film can be increased using the sidewall of the element isolation groove to separate the active region for forming the transistor device. Further, it is possible to form a memory cell by connecting the transistor element and the capacitor element. Thus, it is possible to perform operations of writing, erasing and reading out information (electronic charges) on the capacitive film by driving the transistor element.

According to some embodiments of the present disclosure, a plurality of memory cells are formed on the semiconductor layer so as to make up a memory cell array, and each of the memory cells has the transistor element and the capacitor element (for example, each of these elements). According to this configuration, even if a plurality of memory cells are formed with a high density for high integration, it is possible to form a capacitive film having a large area using the sidewall of the element isolation groove. Accordingly, it is possible to provide a semiconductor memory device that is highly integrated and that also provides high reliability in storing information.

According to some embodiments of the present disclosure, the element isolation groove has a zigzag edge, and the sidewall covering portion is formed on the sidewall along the zigzag edge. According to this configuration, because the element isolation groove has a zigzag edge, the area of the sidewall of the element isolation groove is increased accordingly. Therefore, since the sidewall covering portion of the capacitive film can have a large area, it is possible to further increase the capacitance of the capacitor element.

According to some embodiments of the present disclosure, the active region has a rectangular portion in a part covered by the active region covering portion of the capacitive film, and a recessed portion recessed inwardly in a planar view, as seen from the normal direction of the surface of the semiconductor layer, is formed in at least one edge of the rectangular portion. According to this configuration, the recessed portion is formed in one edge of the rectangular portion of the active region partitioned by the element isolation groove. Thus, the edge of the element isolation groove in the recessed portion is zigzagged. The rectangular portion having the recessed portion on one edge is covered by the active region covering portion of the capacitive film, and a sidewall covering portion is formed on the sidewall of the element isolation groove aligned with the edge having the recessed portion. Therefore, the area of the sidewall covering portion can be increased, which can lead to an increase in the capacitance of the capacitor element.

According to some embodiments of the present disclosure, the active region may include a pair of rectangular portions and a connecting portion which connects the pair of rectangular portions, and the capacitive film may be formed so as to cover an area including the pair of rectangular portions. In this case, a transistor element may be formed in the connecting portion of the active region. For example, the capacitor element may be formed in an area including the rectangular portions and the sidewalls of the element isolation grooves formed along the rectangular portions, and the transistor element may be electrically connected to the capacitor element via the semiconductor layer of the active region.

According to some embodiments of the present disclosure, the semiconductor device may further include an insulating layer that is embedded in the bottom of the element isolation groove and is thicker than the capacitive film. According to this configuration, adjacent active regions can be electrically isolated from each other with the element isolation groove interposed therebetween by the thick insulating layer that is embedded in the bottom of the element isolation groove.

DETAILED DESCRIPTION

Figure 1:
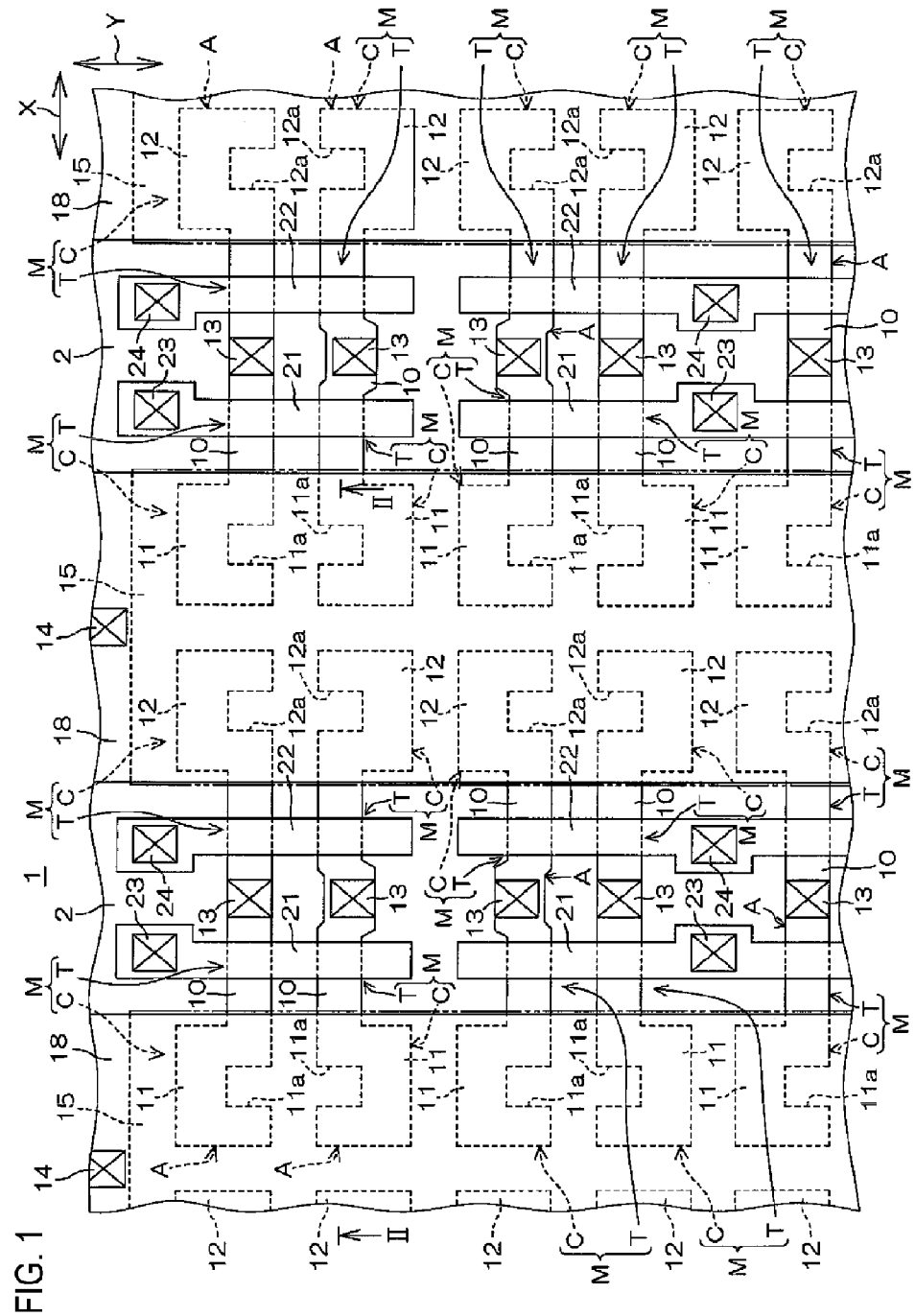
FIG. 1 is a planar view showing a configuration of a part of a semiconductor device according to an embodiment of the present disclosure.
Figure 2:
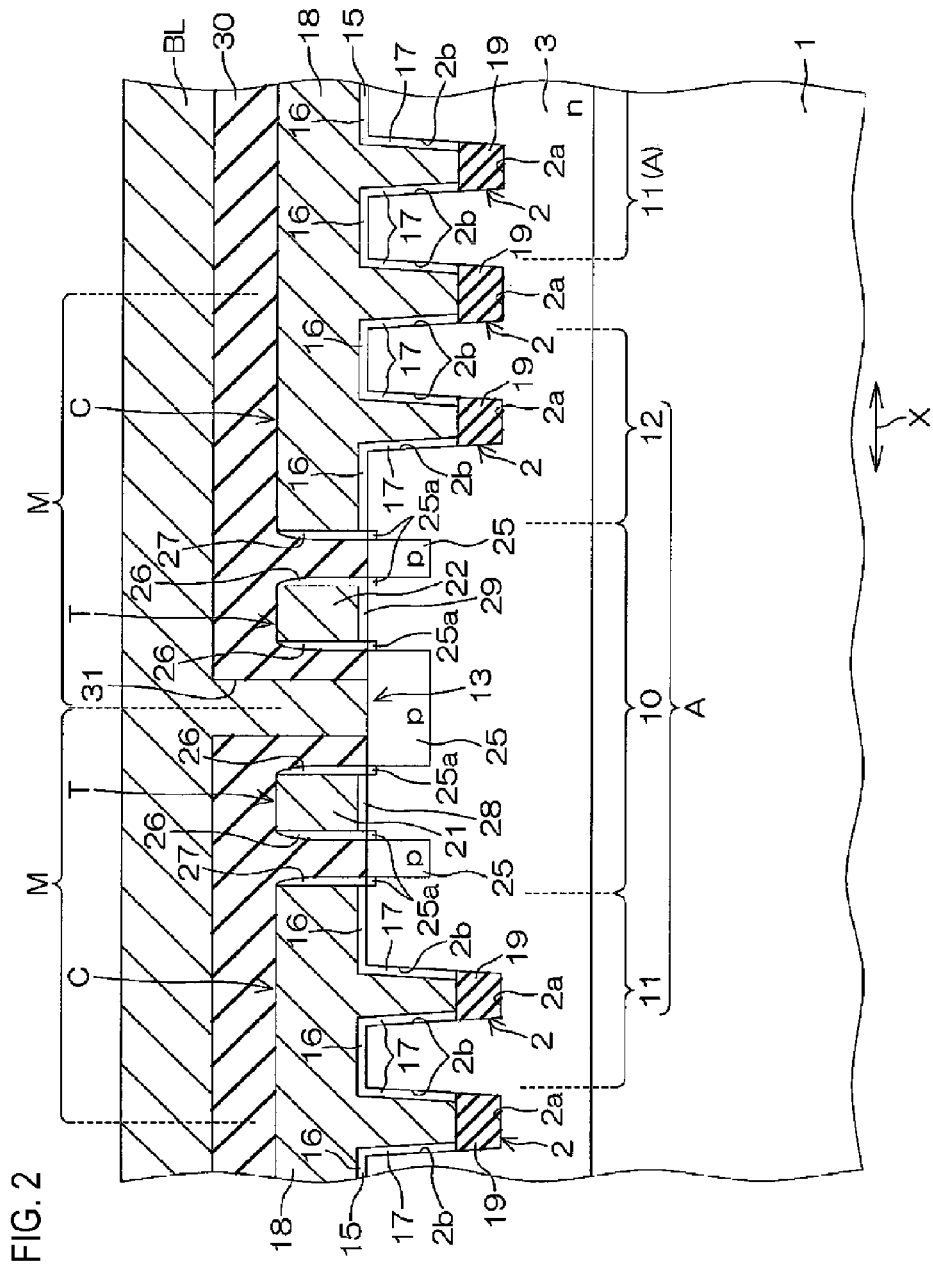
FIG. 2 is a cross-sectional view showing a configuration of a part of the semiconductor device taken along the plane-cutting line II-II of FIG. 1.

In the following, embodiments of the present disclosure will be described in detail with reference to the accompanying drawings. FIG. 1 is a planar view showing a configuration of a part of a semiconductor device according to an embodiment of the present disclosure, and FIG. 2 is a cross-sectional view taken along the plane cutting line II-II of FIG. 1. The semiconductor device has a memory cell array including a plurality of memory cells M formed on a semiconductor substrate (semiconductor layer) 1. The plurality of memory cells M are arranged in a matrix form along the X-direction and the Y-direction perpendicular to the X-direction, as shown in FIG. 1.

Each memory cell M includes a transistor (transistor element) T and a capacitor (capacitor element) C. More specifically, an n-type semiconductor layer (n-type well) 3, formed by diffusing n-type impurities, is formed in a surface layer portion of the semiconductor substrate 1. The n-type semiconductor layer 3 is electrically separated into a plurality of active regions A by element isolation grooves 2. Each element isolation groove 2 is formed to have a depth of, for example, about 3,800 Å.

Each active region A includes a pair of rectangular portions 11 and 12, each having a capacitor, and a connecting portion 10 connecting the pair of rectangular portions 11 and 12, and continuously extends over a pair of adjacent memory cells M in the X-direction. In the semiconductor substrate 1 shown in FIG. 1, element isolation grooves 2 are formed in regions other than where the active regions A (each including the rectangular portions 11 and 12 and the connecting portion 10) are formed. Each of the rectangular portions 11 and 12 of the active region A has a recessed portion 11a and 12a, respectively, which is formed inwardly in a rectangular shape in one edge of each rectangular portion 11 and 12, when seen from the point of the planar view. That is, the edges of the rectangular portions 11 and 12 having the recessed portions 11a and 12a, respectively have a zigzagged pattern. In this embodiment, a pair of adjacent rectangular portions 11 or a pair of adjacent rectangular portions 12 in the Y-direction have their recessed portions 11a or 12a formed in the edges thereof that face each other. The connecting portion 10 is formed in a substantially linear fashion along the X-direction. The plurality of active regions A is formed in a matrix shape along the X- and Y-directions.

Each of the rectangular portions 11 and 12 has a length of, for example, about 400 nm in the X-direction, and a length of, for example, about 260 nm in the Y-direction. Also, each of the recessed portions 11a and 12a has a length of, for example, about 140 nm in the X-direction, and a length of, for example, about 140 nm in the Y-direction. The connecting portion 10 has a width of, for example, about 120 nm in the Y-direction. A distance (i.e., distance in the Y-direction) between two adjacent rectangular portions 11 or between two adjacent rectangular portions 12 in the Y-direction is, for example, about 140 nm.

A capacitive film 15 formed in a strip shape along the Y-direction is provided so as to cover adjacent rectangular portions 11 and 12 in a pair of adjacent active regions A in the X-direction. In other words, the capacitive film 15 is formed integrally so as to cover plural pairs of rectangular portions 11 and 12. The capacitive film 15 is formed of a silicon oxide film which is, for example, 26 Å-36 Å in thickness. The capacitive film 15 has an active region covering portion 16 which covers the surface of the rectangular portion 11 and part of the surface of the connecting portion 10 adjacent to the rectangular portion 11. In addition, the capacitive film 15 has sidewall covering portions 17 which cover the sidewalls of the element isolation grooves 2. The sidewall covering portions 17 are contiguously connected to the active region covering portions 16. Since the sidewall covering portions 17 are formed so as to cover the sidewalls of the element isolation grooves 2 aligned with each edge of the rectangular portions 11 and 12, the sidewall covering portions 17 have a larger area in the zigzag-patterned edges having the recessed portions 11a and 12a.

In addition, an electrode film 18 formed of a conductive polysilicon film (for example, about 1800 Å in thickness) is formed in a strip shape along the Y-direction so as to cover the capacitive film 15. More specifically, the electrode film 18 is formed so as to cover substantially the entire area of the active region covering portion 16 and the sidewall covering portions 17 of the capacitive film 15. In this embodiment, the capacitive film 15 and the electrode film 18 are formed in the same pattern with respect to the X-direction. However, in FIG. 1, for the sake of ease of understanding, the end edges of the capacitive film 15 and the electrode film 18 in the X-direction are illustrated to be out of alignment with each other and shown using different types of lines (a solid line and a chain double-dashed line, respectively). The electrode film 18 has a portion extending outside the capacitive film 15 with respect to the Y-direction, and a contact position 14 is arranged in the extended portion of the electrode film 18.

A contact position 13 is arranged substantially in the middle of the connecting portion 10 of the active region A. Between the contact position 13 and each of the rectangular portions 11 and 12, a gate 21 or 22 is formed so as to traverse the connecting portion 10 in the Y-direction above the active region A, as shown in FIG. 1. The gates 21 and 22 are formed to have contact positions 23 and 24, respectively, and span a pair of active regions A adjacent to the contact positions 23 and 24 in the Y-direction and another pair of active regions A adjacent thereto in the Y-direction. The gates 21 and 22 are formed of, for example, a polysilicon film having electrical conductivity.

As shown in FIG. 2, in the active region A (the connecting portion 10), the gates 21 and 22 are opposed to the n-type semiconductor layer 3 with gate insulating films 28 and 29 respectively interposed therebetween. The gate insulating films 28 and 29 are formed of, for example, a silicon oxide film that is about 26 Å~36 Å in thickness.

In the active region A (the connecting portion 10) on both sides of the gates 21 and 22, a source-drain layer 25 is formed by injecting a p-type impurity. The source-drain layer 25 between the gates 21 and 22 is shared by two transistors T in a pair of adjacent memory cells M arranged in the X-direction, and the contact position 13 is arranged on the shared source-drain layer 25. An interlayer insulating film 30 (not shown in FIG. 1) is formed so as to cover the gates 21 and 22, and a contact hole 31 is formed at the contact position 13 in the interlayer insulating film 30. A bit line BL (not shown in FIG. 1) is connected to the shared source-drain layer 25 through the contact hole 31.

The bit line BL commonly connects the source-drain layers 25 on one side of respective transistors T in a plurality of memory cells M aligned along the X-direction. In addition, a word line (not shown) extending in the Y-direction is connected to the contact positions 23 and 24 of the respective gates 21 and 22. The word line commonly connects the gates of the transistors T in a plurality of memory cells M aligned along the Y-direction. In the above configuration, the Y-direction may be referred to as a word-line direction, and the X-direction perpendicular to the Y-direction may be referred to as a bit-line direction.

On both sidewalls of the gates 21 and 22 and on the sidewall of the electrode film 18, sidewall insulating films 26 and 27 are formed, respectively. In the semiconductor substrate 1 below the sidewall insulating film 26 on both sidewalls of the gate 21 and 22, low impurity-concentration regions 25a are formed to be aligned with source-drain layer 25. The above configuration forms an LDD (Lightly Doped Drain) structure.

The element isolation groove 2 forms an element isolation structure for electrically isolating a plurality of active regions A using a so-called STI (Shallow Trench Isolation) structure.

The element isolation groove 2 includes a bottom surface 2a and sidewalls 2b extending upward from the periphery of the bottom surface 2a. In this embodiment, the sidewall 2b extends in an obliquely upward direction, such that the groove 2 has a greater width in a shallower portion of the groove 2. The sidewall 2b is covered by the sidewall covering portion 17 of the capacitive film 15. The surface of the active region A aligned with the sidewall 2b is covered by the active region covering portion 16. An insulating layer 19, which is thicker than the capacitive film 15, is embedded in the bottom portion of the element isolation groove 2, so as to cover the bottom surface 2a. The thick insulating layer 19 ensures electrical isolation between two adjacent active regions A. The insulating layer 19 is formed of, for example, a silicon oxide film that is about 1200 Å in thickness.

Each transistor T and associated capacitor C are electrically connected to each other via the n-type semiconductor layer 3. Specifically, a portion of the n-type semiconductor layer 3 in the vicinity of the source-drain layer 25 facing the capacitive film 15 forms one electrode of the capacitor C, and the electrode film 18 laminated on the capacitive film 15 forms the other electrode of the capacitor C. Thus, the transistor T and the capacitor C are connected in series to form a memory cell M.

Figure 3:
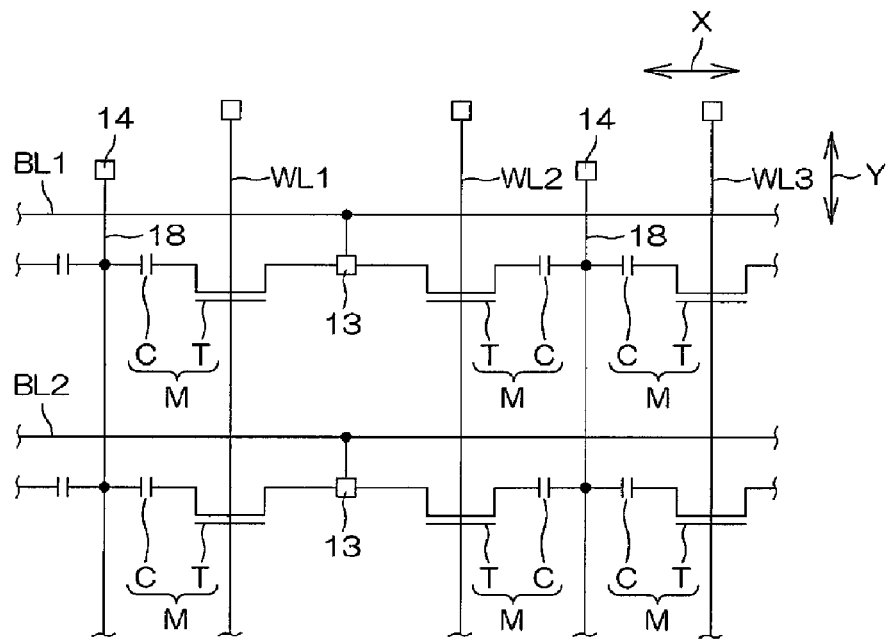
FIG. 3 is a circuit diagram showing an electrical configuration of a part of the semiconductor device according to an embodiment of the present disclosure.

FIG. 3 is an electrical circuit diagram showing an electrical configuration of a part of the semiconductor device according to an embodiment. The gates of the transistors T in a plurality of memory cells M aligned in the Y-direction are connected in common, respectively, to the word line WL (WL1, WL2, WL3). The word line WL and each gate are connected at the contact positions 23 and 24 (see FIG. 1). In addition, the drains of the transistors T in a plurality of memory cells M aligned in the X-direction are connected in common, respectively, to the bit line BL (BL1, BL2) at the contact position 13 (see FIG. 1). In each of the memory cells M, the capacitor C is connected in series to the transistor T. The capacitor C is connected to the electrode film 18 on the side opposite to the transistor T. The electrode film 18 extends continuously over the capacitors C in the plurality of memory cells M aligned in the Y-direction. The electrode film 18 may be connected to some wirings (not shown) at the contact position 14 (see FIG. 1). Electrical isolation between two adjacent capacitors C in the X-direction or in the Y-direction is achieved by means of the element isolation groove 2 and the insulating layer 19 embedded in the bottom portion of the groove 2. According to this configuration, a memory cell array is formed in which memory cells M, each having a one transistor-one capacitor structure, are arranged in a matrix form on the semiconductor substrate 1.

Figure 4A:
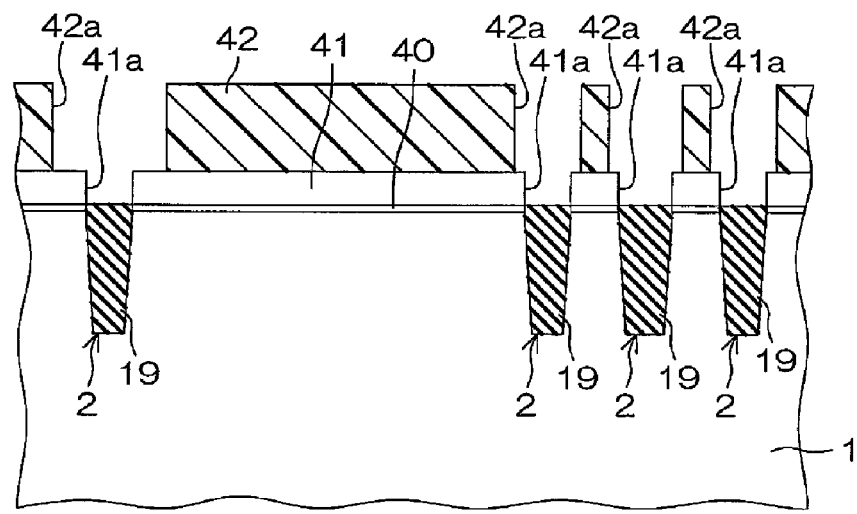
FIG. 4A is a cross-sectional view showing a manufacturing step of the semiconductor device according to an embodiment of the present disclosure.

FIGS. 4A to 4I are cross-sectional views showing sequential manufacturing steps of the semiconductor device according to an embodiment. First, as shown in FIG. 4A, the element isolation groove 2 is formed by digging into the semiconductor substrate 1, and the insulating layer 19 is embedded in the element isolation groove 2, thereby forming a STI structure. The insulating layer 19 may include, for example, a silicon oxide film formed by a HDP (High Density Plasma CVD) method, which will be described in more detail. Prior to the formation of the element isolation groove 2, a pad oxide film 40 is formed on the surface of the semiconductor substrate 1, and a nitride film 41 (for example, a silicon nitride film) is formed on the pad oxide film 40. Then, an opening 41a aligned with element isolation groove 2 is formed in the nitride film 41. The element isolation groove 2 is formed by etching with the use of the nitride film 41 as a mask, and the insulating layer 19 is embedded in the element isolation groove 2. After such embedment of the insulating layer 19 is completed, a photoresist film 42 having an opening 42a for exposing the vicinity of the element isolation groove 2 is formed on the nitride film 41.

Figure 4B:
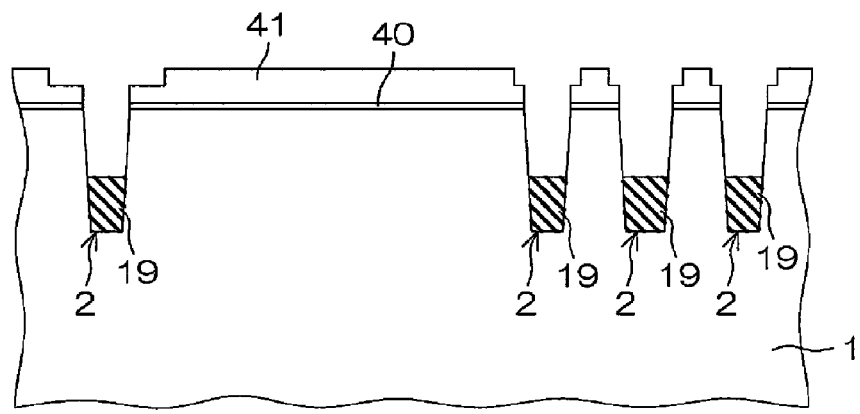
FIG. 4B is a cross-sectional view showing a step after the step of FIG. 4A.

Then, as shown in FIG. 4B, the insulating layer 19 in the element isolation groove 2 is thinned by dry etching. As a result, the insulating layer 19 having a predetermined thickness is formed in the bottom portion of the element isolation groove 2. Then, peeling of the photoresist film 42 and cleaning of the substrate surface are performed by ashing and SPM (Sulfuric acid/hydrogen Peroxide Mixture) cleaning, respectively.

Figure 4C:
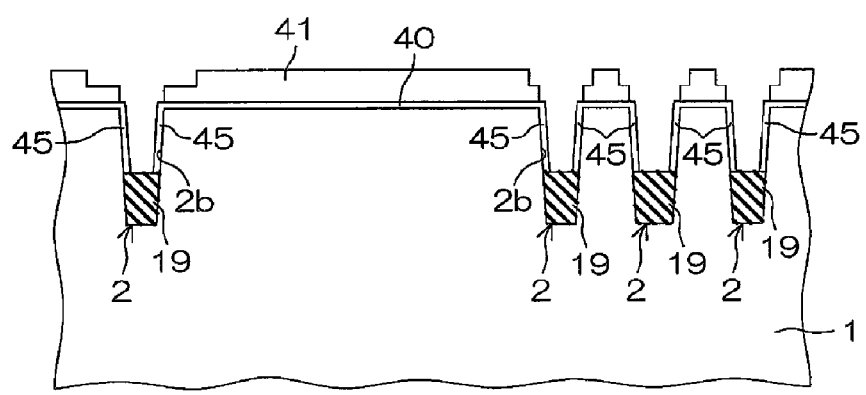
FIG. 4C is a cross-sectional view showing a step after the step of FIG. 4B.
Figure 4D:
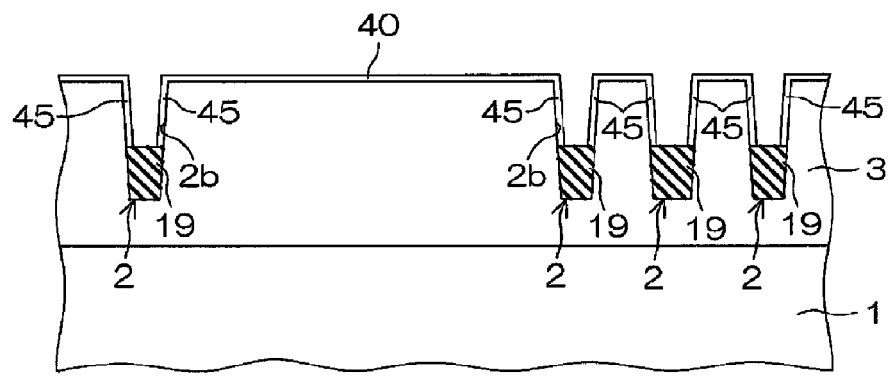
FIG. 4D is a cross-sectional view showing a step after the step of FIG. 4C.
Figure 4E:
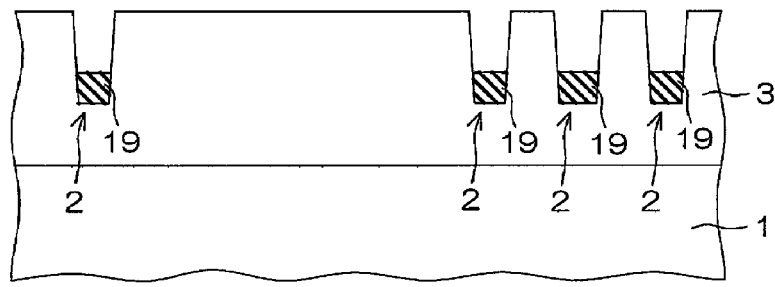
FIG. 4E is a cross-sectional view showing a step after the step of FIG. 4D.

Subsequently, as shown in FIG. 4C, a sacrificial oxide film 45 is formed on the sidewall 2b of the element isolation groove 2 by thermal oxidation. In addition, as shown in FIG. 4D, the nitride film 41 is peeled off, and then, an n-type semiconductor layer (n-type well) 3 is formed by injecting and spreading n-type ions into the semiconductor substrate 1. Then, as shown in FIG. 4E, the pad oxide film 40 and the sacrificial oxide film 45 are peeled off by for example, hydrofluoric acid etching.

Figure 4F:
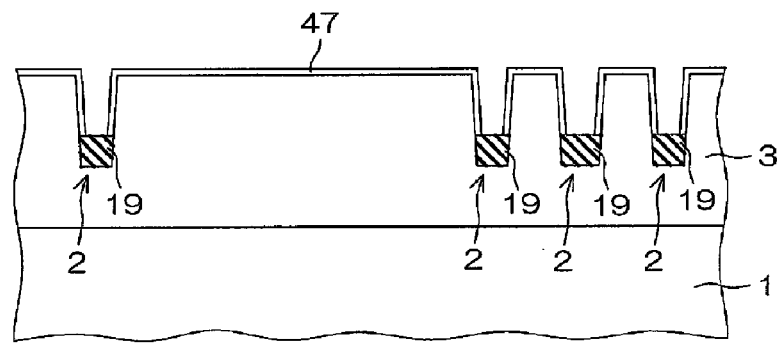
FIG. 4F is a cross-sectional view showing a step after the step of FIG. 4E.
Figure 4G:
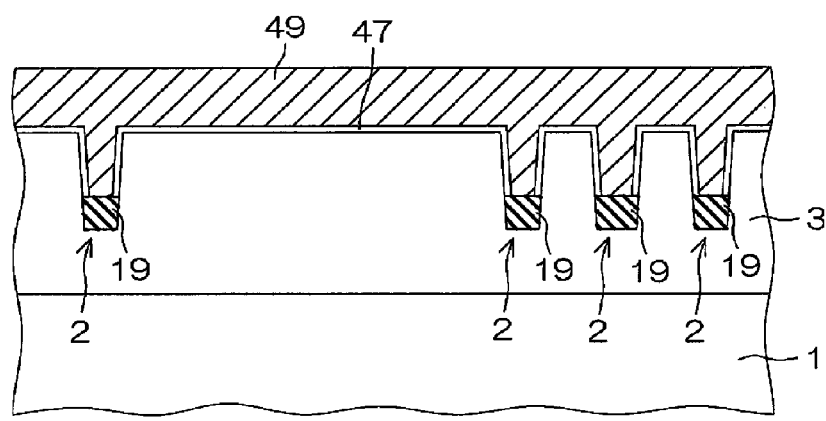
FIG. 4G is a cross-sectional view showing a step after the step of FIG. 4F.
Figure 4H:
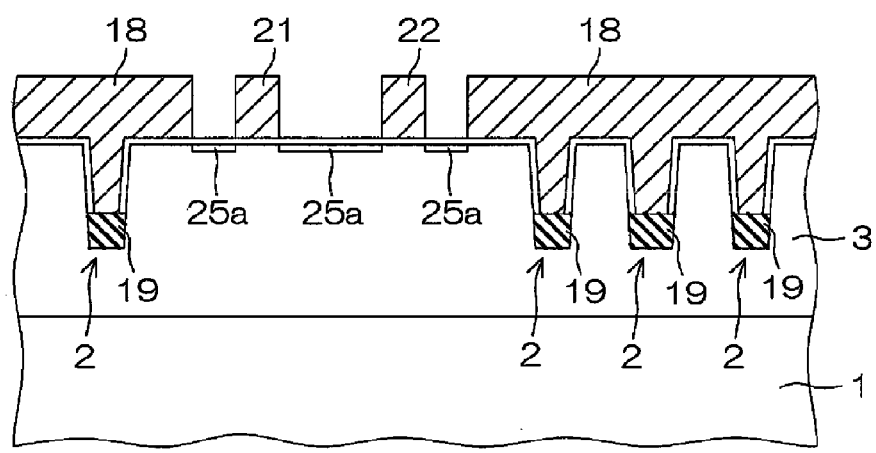
FIG. 4H is a cross-sectional view showing a step after the step of FIG. 4G.

Next, as shown in FIG. 4F, a thermal oxide film 47, which forms the gate insulating films 28 and 29 and the capacitive film 15 (see FIG. 2), is formed by a thermal oxidation process. Then, as shown in FIG. 4G, a polysilicon film 49 with conductivity by doping p-type impurities is formed on the thermal oxide film 47. Then, as shown in FIG. 4H, the polysilicon film 49 is etched in the patterns of the gates 21 and 22 and the electrode film 18. In this state, a LDD implantation is performed by injecting ions, with the use of the gates 21 and 22 and the electrode film 18 as a mask. As a result, a low impurity-concentration region 25a is formed.

Figure 4I:
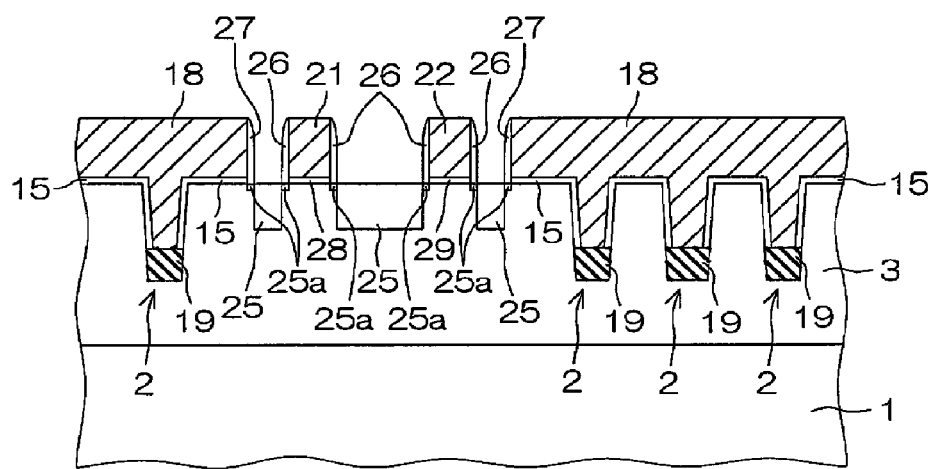
FIG. 4I is a cross-sectional view showing a step after the step of FIG. 4H.

Then, as shown in FIG. 4I, the thermal oxide film 47 is patterned using the gates 21 and 22 and the electrode film 18 as a mask, to be separated into gate insulating films 28 and 29 and a capacitive film 15. Further, on the sidewalls of the gate 21 and 22 and the electrode film 18, sidewall insulating films 26 and 27 are formed. In addition, by injecting and diffusing p-type impurity ions into the n-type semiconductor layer 3 using the sidewall insulating films 26 and 27 as a mask, the source-drain layer 25 is formed. Then, the semiconductor device including the cross-sectional structure shown in FIG. 2 can be obtained by forming an interlayer insulating film 30 and the like.

As described above, according to this embodiment, the capacitive film 15 is formed by using the sidewalls of the element isolation groove 2 for separating a plurality of active regions A on the semiconductor substrate 1. Thus, it is possible to increase the area of the capacitive film 15 without needing to secure additional regions for placing the capacitive film. Therefore, the capacitance of the capacitor C can be increased without requiring a significant increase in the area occupied by the capacitor C, and a highly-reliable semiconductor memory device can be provided in which memory cells M are highly integrated and each memory cell M includes a capacitor C with sufficient capacitance. Moreover, the active region A includes a zigzag edge in the rectangular portions 11 and 12 covered by the active region covering portion 16 of the capacitive film 15. Thus, the length of the edge of the active region A can be increased, so that the area of the sidewalls of the element isolation groove 2 aligned with the edge can also be enlarged. This further increases the capacitance of the capacitor C, thus achieving a more reliable semiconductor memory device.

Figure 5A:
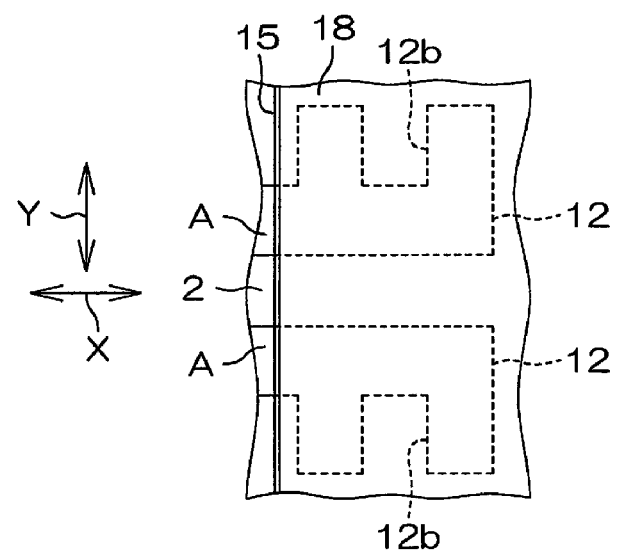
FIG. 5A is a planar view schematically showing an example of the shape of a portion covered by a capacitive film in an active region.
Figure 5B:
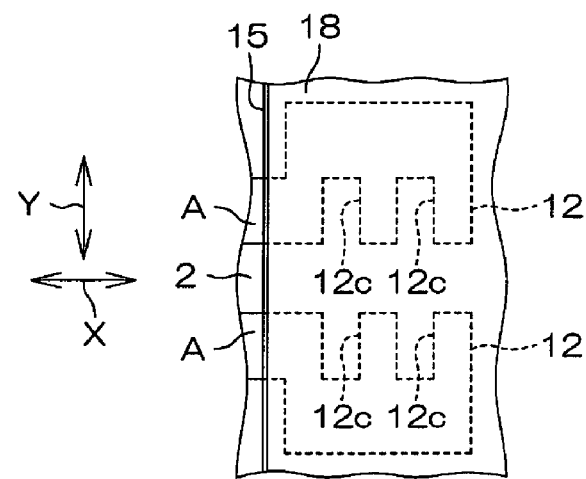
FIG. 5B is a planar view schematically showing another example of the shape of the portion covered by the capacitive film in the active region.
Figure 5C:
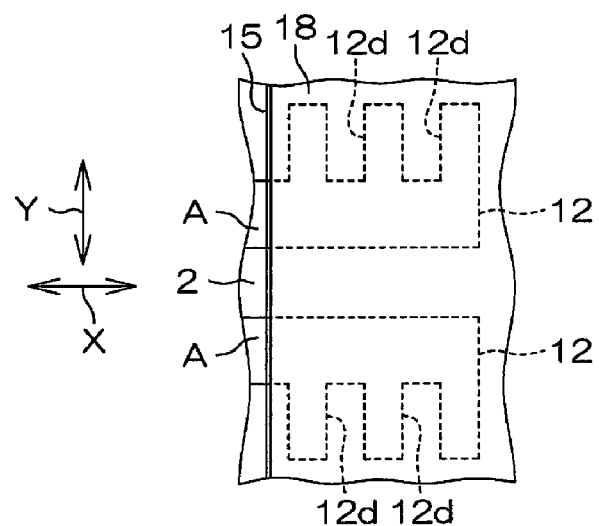
FIG. 5C is a planar view schematically showing another example of the shape of the portion covered by the capacitive film in the active region.
Figure 5D:
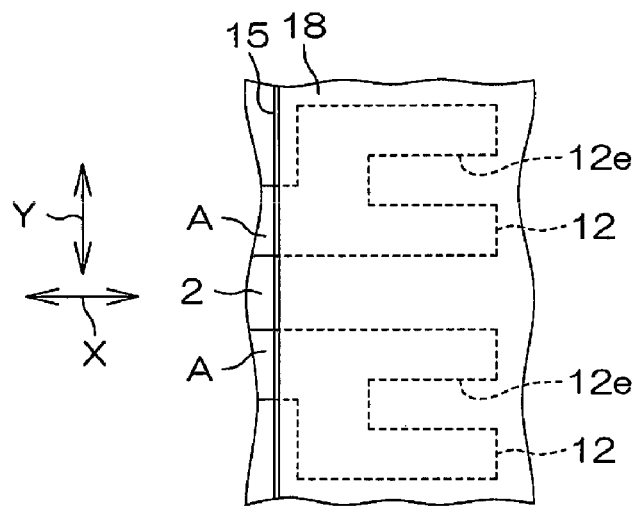
FIG. 5D is a planar view schematically showing another example of the shape of the portion covered by the capacitive film in the active region.
Figure 5E:
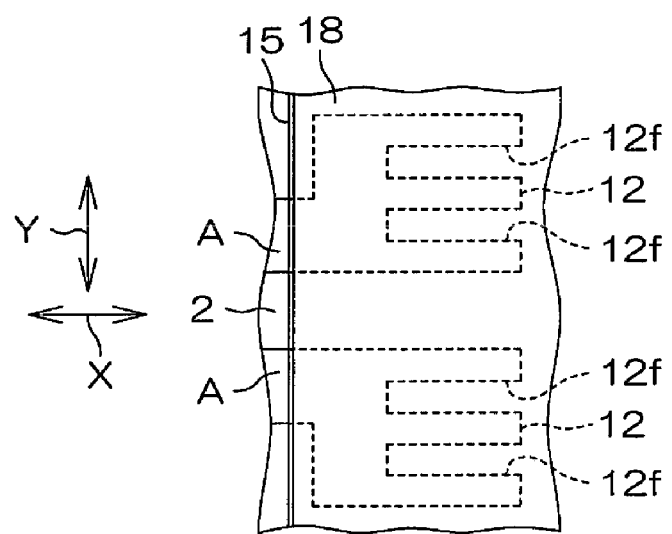
FIG. 5E is a planar view schematically showing another example of the shape of the portion covered by the capacitive film in the active region.

FIGS. 5A to 5E are planar views schematically showing modified examples of the portion covered by the active region covering portion 16 of the capacitive film 15 in the active region A. FIG. 5A shows an example of recessed portions 12b in a pair of adjacent rectangular portions 12 in the Y-direction. In this example, the recessed portions 12b are formed in the outward-facing edges of the rectangular portions 12 with regard to the Y-direction. FIG. 5B shows an example of recessed portions 12c in a pair of adjacent rectangular portions 12 in the Y-direction. In this example, two recessed portions 12c are formed at predetermined intervals in the X-direction in the inward-facing edges of the pair of rectangular portions 12 with respect to the Y-direction. This allows for an even greater area of the sidewall of the element isolation groove 2 and an even a greater capacitance of the capacitor C. FIG. 5C shows an example of recessed portions 12d in a pair of adjacent rectangular portions 12 in the Y-direction. In this example, two recessed portions 12d are formed at predetermined intervals in the X-direction in the outward-facing edges of the rectangular portions 12 with respect to the Y-direction. FIGS. 5D and 5E show examples of recessed portions 12e and 12f, respectively, which are recessed along the X-direction in the edges of the rectangular portions 12 arranged along the Y-direction. One recessed portion 12e is formed in one edge of the rectangular portions 12 in the configuration shown in FIG. 5D, while two recessed portions 12f are formed in one edge of the rectangular portions 12 in the configuration shown in FIG. 5E. Since either configuration has a zigzag-patterned edge on one side of the rectangular portion 12, the area of the sidewall of the element isolation groove 2 can be increased accordingly. Therefore, the area of the capacitive film 15 can be increased, which also leads to an increase in the capacitance of the capacitor C.

Even though some embodiments of the present disclosure have been described above, the present disclosure may also be carried out in yet other embodiments. For example, the above-described embodiments show a configuration with the rectangular portions having the zigzag-patterned edges in the region in which the active region A is covered by the capacitive film 15. However, in other embodiments, the active region A covered by the capacitive film 15 may have a rectangular portion with differently-patterned edges from the zigzag-patterned edges. In addition, it is not necessary that the shape of the active region A covered by the active region covering portion 16 be rectangular.

Further, the above-described embodiments show examples including one zigzag-pattern edge of the rectangular portions 11 and 12. Alternatively, the above embodiments may be implemented using two or more edges being zigzag-patterned. In addition, the zigzag-patterned edge is formed by the rectangular recessed portion in the above-described embodiments. However, the zigzag-patterned edge may be formed by a recessed portion of any shape, such as triangular, semi-circular, semi-elliptic, or the like, and may also be formed by a convex shape.

Further, the above-described embodiments have shown examples of the transistor T formed of a p-type channel MOSFET by forming a p-type source-drain layer in the n-type semiconductor layer 3. However, the transistor T may be formed of an n-type channel MOSFET by inverting the conductivity type of each layer. In addition, a variety of design changes may be performed within the scope of the claims.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
a semiconductor layer including a plurality of active regions that are separated by element isolation grooves;
a capacitive film including a sidewall covering portion configured to cover a sidewall of the element isolation grooves; and
an electrode film laminated on the capacitive film;
wherein the semiconductor layer, the capacitive film and the electrode film form a capacitor element of the semiconductor device;
wherein the element isolation grooves form a zigzag-patterned edge when viewed from a planar view; and
wherein the sidewall covering portion is formed on the sidewall along the zigzag-patterned edge.

2. The semiconductor device of claim 1, wherein the capacitive film includes an active region covering portion configured to cover a surface of the active regions.

3. The semiconductor device of claim 1, further comprising a transistor element formed in each of the active regions, the transistor element being electrically connected to the capacitor element.

4. The semiconductor device of claim 3, wherein a plurality of memory cells are formed on the semiconductor layer so as to make up a memory cell array, each memory cell including the transistor element and the capacitor element.

5. The semiconductor device of claim 2, wherein the active region includes a rectangular portion partly covered by the active region covering portion of the capacitive film, and
wherein a recessed portion is formed in at least one edge of the rectangular portion, the recessed portion being recessed inward when seen from a point of view above a surface of the semiconductor layer.

6. The semiconductor device of claim 1, wherein each of the active regions includes a pair of rectangular portions and a connecting portion configured to connect the pair of rectangular portions, and
wherein the capacitive film is formed so as to cover an area including the pair of rectangular portions.

7. The semiconductor device of claim 6, wherein a transistor element is formed in the connecting portion of the active region.

8. The semiconductor device of claim 7, wherein the capacitor element is formed in an area including the rectangular portions and the sidewall of the element isolation grooves formed along the rectangular portions, and
wherein the transistor element and the capacitor element are electrically connected to each other.

9. The semiconductor device of claim 1, further comprising an insulating layer embedded in a bottom portion of the element isolation grooves, the insulating layer being thicker than the capacitive film.

* * * * *